United States Patent [19]

LoCascio et al.

[11] 4,358,812
[45] Nov. 9, 1982

[54] DRIVER CIRCUIT FOR USE WITH INDUCTIVE LOADS OR THE LIKE

[75] Inventors: James J. LoCascio, Mesa; Robert B. Jarrett, Tempe, both of Ariz.

[73] Assignee: Motorola, Inc., Schaumburg, Ill.

[21] Appl. No.: 231,550

[22] Filed: Feb. 4, 1981

[51] Int. Cl.³ .......................................... H01H 47/32
[52] U.S. Cl. .................................. 361/152; 123/490; 361/154
[58] Field of Search ............... 361/139, 160, 152, 154; 123/490

[56] References Cited

U.S. PATENT DOCUMENTS

| | | | |
|---|---|---|---|
| 4,234,903 | 11/1980 | Harper | 361/154 |
| 4,266,261 | 5/1981 | Streit et al. | 361/154 |
| 4,293,888 | 10/1981 | McCarty | 361/152 |
| 4,300,508 | 11/1981 | Streit et al. | 361/154 X |

*Primary Examiner*—Harry E. Moose, Jr.
*Attorney, Agent, or Firm*—Michael D. Bingham

[57] ABSTRACT

An integrated circuit is operative to produce an output current to a load and for switching the output current when a predetermined peak magnitude of load current is reached to a lower predetermined constant value. The circuit includes an internal power stage rendered conductive for producing maximum load current through the external load which is connected in series therewith in response to an internally generated reference current. The power stage comprises a multi-emitter power transistor with each emitter coupled to a respective emitter ballast resistor such that the load current through one of the resistors may be sensed and compared to the reference current to cause the magnitude of this reference current to be switched from a maximum value to a minimum value when the sensed current is representative of the peak magnitude value of current to thereby reduce the load current until the magnitude thereof is representative of the lower level of reference current.

17 Claims, 6 Drawing Figures

DRIVER CIRCUIT FOR USE WITH INDUCTIVE LOADS OR THE LIKE

BACKGROUND OF THE INVENTION

1. Field of the Invention

This invention relates to a circuit for driving inductive loads and more particularly to a monolithic integrated circuit for supplying in rush and sustaining current level drive signals to operate an inductive solenoid device.

2. Description of the Prior Art

Solenoids operated by generating a magnetic field are generally known in the art. The magnetic field is produced by causing current to flow through an inductive field coil. In most applications utilizing solenoids it is desired to initially place a maximum voltage across the field coil to allow the current to ramp therethrough to a peak magnitude, the value of which is limited only by the time constant of the coil. For example, electronic fuel injection systems have injector valves which are comprised of solenoids with inductive coils for opening and closing the valves in timed relationship to the operation of the automotive engine. Hence, the correct cylinder of the engine can be supplied with the correct fuel mixture at the correct sequence in the engine firing cycle. Because of the magnetic characteristics of the inductive field coils whether used in fuel injection systems for driving the magnetic valves or electronic ignition systems wherein once the magnetic field has been established by the current ramping to the peak magnitude, maintenance of the field requires less current. Thus, in order to open the valves as quickly as possible, rapid current buildup in the coil is needed. However, after the valve is initially opened, a reduced or sustaining level of current can then be applied to maintain the valve in an open state. This sustaining current level allows for fast closing of the valves in the correct time relationship and also helps to prevent overheating of the valves which could otherwise occur with the higher level current being maintained for a period of time.

Most, if not all of the prior art, including fuel injection systems, comprises a driver circuit and a discrete power device. The discrete power device is coupled in series between the injector valve, for instance, and a discrete sense resistor. In operation the driver circuit which may be a monolithic integrated circuit, is driven by an input signal in timed relation to the engine operation to turn on the discrete power device at the correct sequence in the engine cycle to allow maximum in rush current to open the valves. Once the peak current level is reached, a voltage developed across the sense resistor is usually compared with a referenced voltage set in the driver circuit to reduce the drive to the discrete power device in order to reduce the field current through the inductive coil to a sustaining level.

In order to reduce component cost for the inductive driver systems it is desirable to have the driver circuit, the power device and sense resistor on one single monolithic integrated circuit chip.

SUMMARY OF THE INVENTION

Accordingly, it is an object of the present invention to provide a system for controlling the current in an inductive load.

Another object of the present invention is to provide a single integrated driver circuit chip for providing a multi-level drive current to a load.

Still another object of the present invention is to provide a single integrated driver circuit chip for providing multi-level current drive to an inductive load and including on chip thermal protection.

A further object of the invention is to provide a driver circuit for driving fuel injectors having inductive coils.

A still further object is to provide a $T^2L$ compatible integrated circuit functioning as a driver circuit for providing multi-level current to an inductive load and which can be programmed to function only as an integrated power switch.

In accordance with the above and other objects there is provided an integrated circuit for providing a multi-level current to a load comprising a power stage including load current sensing circuitry for supplying load current and sensing a proportional amount of the load current. The sensed load current is compared by a comparator to a first internally generated reference current produced by a current reference source such that said comparator reduces the drive signal supplied thereby to said power stage when the sensed load current is representative of the first reference current and further causes the current from the reference current source to be reduced to a minimum value whereby the load current is reduced to a constant level representative of said minimum reference current value.

In one feature of the invention a programmable circuit is provided which in a first application is adapted to receive an input signal for reducing the load current to the reduced constant level after a predetermined interval if the load current does not reach a value representative of said first reference current. In a second application the input of the programmable circuit is connected to the input of the integrated circuit whereby the integrated circuit functions as a power switch for providing a substantially constant current.

DETAILED DESCRIPTION

Figure 1:
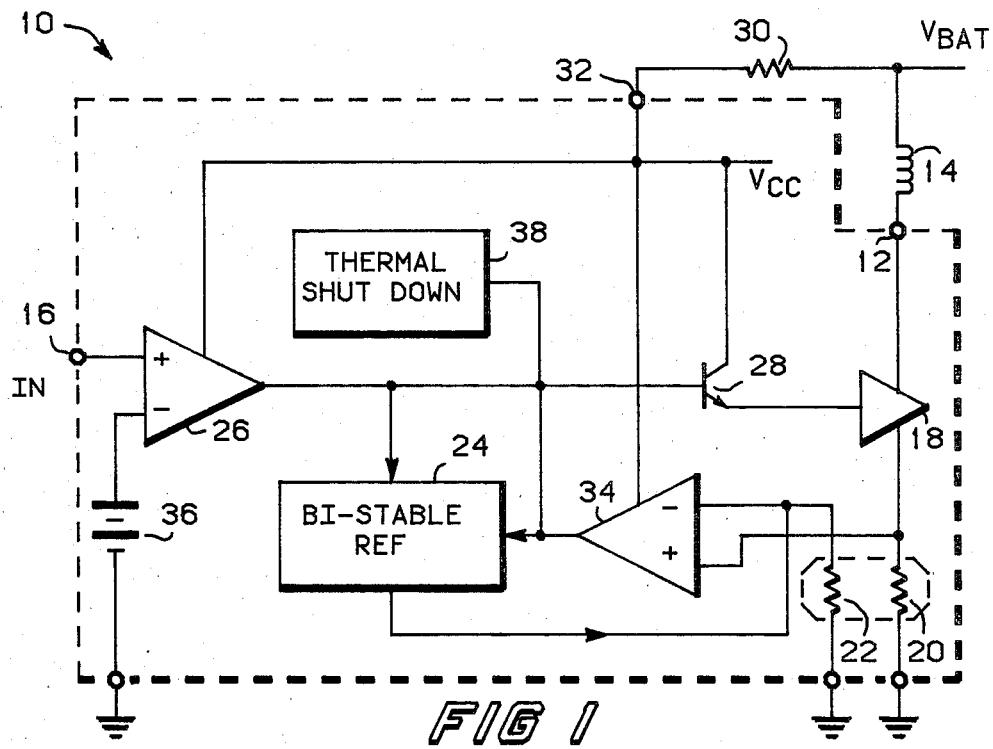
FIG. 1 is a partial schematic and block diagram for describing the embodiment of the load driver circuit of the present invention.
Figure 2D:
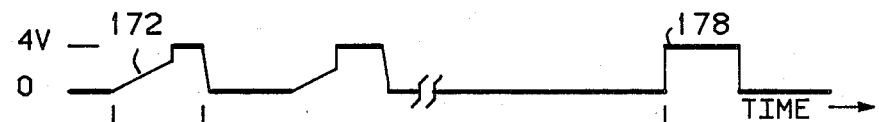
FIGS. 2A–D are curves illustrating waveforms useful for understanding the operation of the present embodiment.

Turning to FIG. 1 there is shown load driver circuit 10 of the present invention in block diagram form for explaining the general operation of the preferred embodiment of the invention. As indicated by the dashed outline form, driver circuit 10 which includes an internal power stage is suitable to be fabricated in monolithic integrated circuit form. Output terminal 12 as shown may be coupled to one terminal of an external inductive coil 14, the other terminal of which is connected to a potential source $V_{BAT}$. It is understood that a resistive load could be driven by driver circuit 10. If, for example, inductive coil 14 is part of a fuel injection system, $V_{BAT}$ would be the battery voltage and inductive coil 14 would be utilized to generate a magnetic field in response to a current conducted therethrough to operate the injector valves of the fuel injector system as is understood. Hence, in the present invention an input signal generated in timed relationship to the operation of the automotive engine is applied to input terminal 16 to open and close the valves in response to the magnetic field produced across inductive coil 14. As will be later explained, in response to the input signal, internal power stage or device 18 of the monolithic circuit is rendered fully conductive so that maximum ramp current is generated through inductive coil 14. As will be more fully explained a basic difference between the subject invention and the prior art is that the current through sense resistor 20 which is coupled in series between power device 18 and ground reference is compared to the current through reference resistor 22 to limit the current through inductive coil 14 to a predetermined peak magnitude. Therefore, in response to an input signal applied to input terminal 16 (FIG. 2b) switching from a low-level state to a high-level state at time t1 comparator 26 produces an output signal for providing both base drive to the base of transistor 28 as well as placing bistable reference circuit 24 in a first state for supplying a first reference current through resistor 22. Therefore with a source of operating potential VCC being supplied at terminal 32 in response to $V_{BAT}$ via resistor 30, a drive signal to power device 18 is provided through the collector-to-emitter path of transistor 28. Power device 18 is thus driven into a saturated state by the drive signal to allow the maximum voltage to be placed across inductive coil 14 to allow the current therethrough to ramp to a maximum limit which is substantially equal to the reference current provided by bistable reference current means or bistable reference circuit 24 through reference resistor 22. This is illustrated in FIG. 2a betweens times t1 and t2. During the aforementioned time interval, the output from bistable reference 24 is maintained at a first maximum level by comparator 26. When the current through inductive coil 14 reaches the peak magnitude, this condition is sensed across resistor 20 such that comparator 34 is caused to change states to source current away from transistor 28 and at the same time to cause bistable reference circuit 24 to switch states. This causes the current at the output of circuit 24 to be reduced to a lower or sustain level whereby the current conducted through conductive coil 14 is quickly reduced to this sustain level value as shown between time t2 and t3-t4. At time t4 the input signal to circuit 10 goes to a low level state which turns off the driver circuit such that the current through inductive coil 14 is reduced to a zero level. Thus, it is immediately seen that one difference of the subject invention over prior art circuits is that the current produced through conductive coil 14 is referenced to an internal current provided in the driver circuit whereas prior art circuits compare the voltage level of the voltage developed across the sense resistor to an internal or externally generated voltage reference, not to a current reference.

Resistors 20 and 22 are shown within a dashed outline to indicate that these components are co-located within the monolithic circuit. Therefore, with these two components being fabricated of like material, for example, the same semiconductor material utilized in forming the emitter of transistor 28 these two resistors will have equal process variations and temperature characteristics. Hence, the switching characteristics of the system between the peak and sustaining current levels is not an absolute function of the voltages developed across these two resistors. Furthermore, by trimming resistor values, process and temperature variations are eliminated between production integrated circuits manufactured in accordance with the preferred embodiment. Typically, the ratio between the peak current level and the sustaining current level as shown in FIG. 2a is four to one.

Bias voltage 36 is shown to indicate that the input levels to circuit 10 is compatible with transistor-to-transistor logic (TTL) such that the circuit can be utilized with TTL logic circuitry.

A thermal shutdown circuit 38 is shown for sensing the power dissipation in power device 18 to shut circuit 10 down if excessive power is dissipated in the power device. Thus damage to the integrated circuit is prevented.

Figure 3:
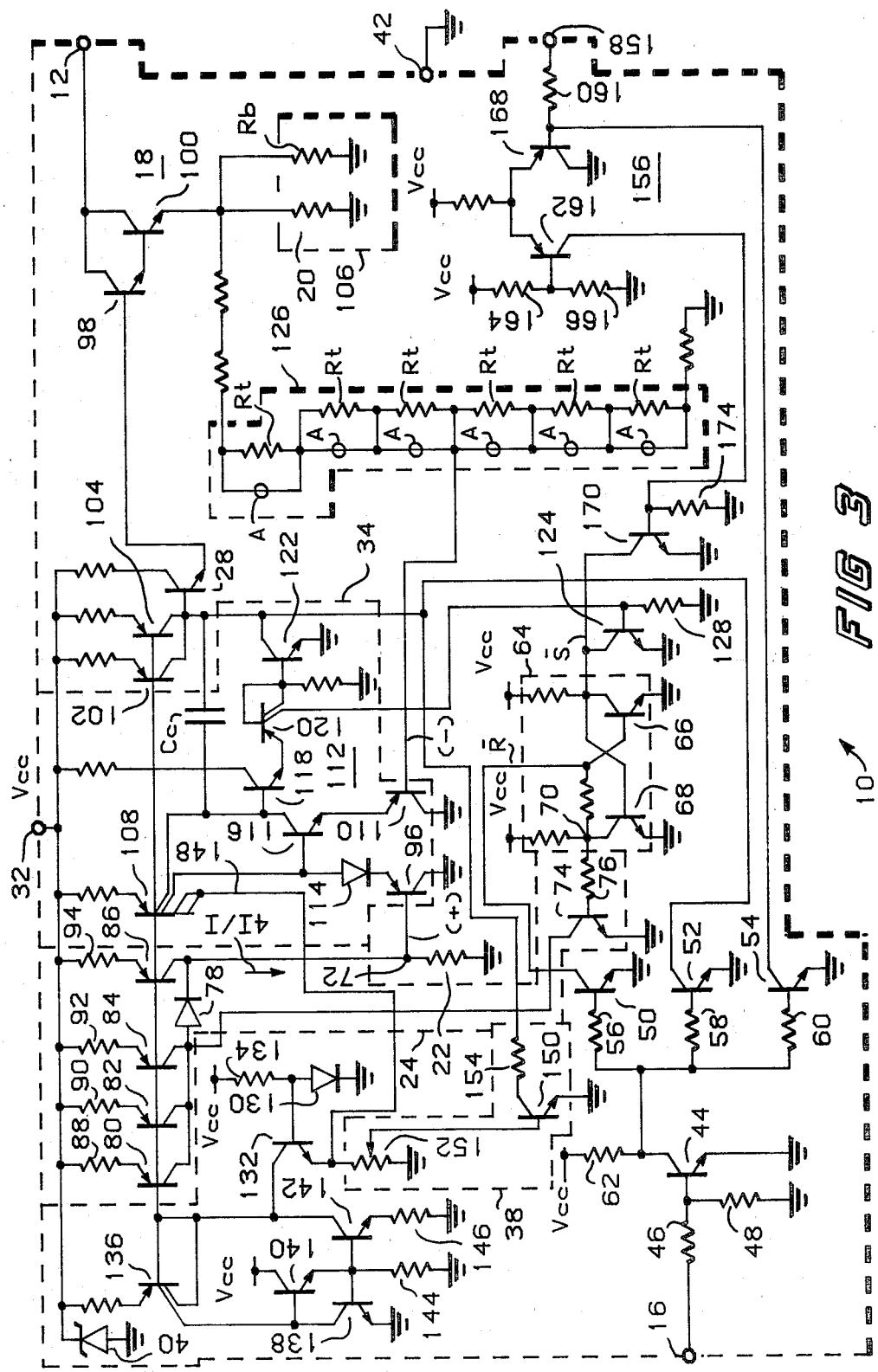
FIG. 3 is a complete schematic diagram of the embodiment of the present invention.

Turning now to FIG. 3, drive circuit 10 of the preferred embodiment is shown in complete detail. As shown, like components to components of FIG. 1 are referenced by the same numerals. Driver circuit 10 of FIG. 3 is shown included within a dashed outline form to indicate that all of the components therein are incorporated into a single monolithic integrated circuit chip. As heretofore described, VCC terminal 32 is coupled to a source of operating potential such as a battery. Zener diode 40 is provided between terminal 32 and a ground reference terminal 42 which is adapted to be connected to ground reference potential. Zener diode 40 limits the operating potential for driver circuit 10 to a predetermined voltage level and protects the driver circuit from "load dump" transients which could otherwise occur if driver circuit 10 is utilized in the fuel injection system of an automobile as is generally understood.

Figure 2C:
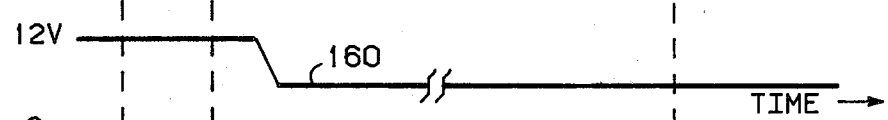
Figure 2B:
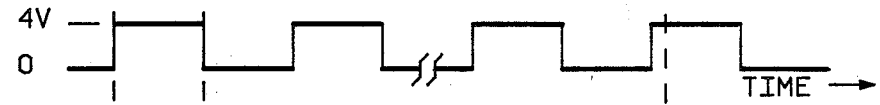
Figure 2A:
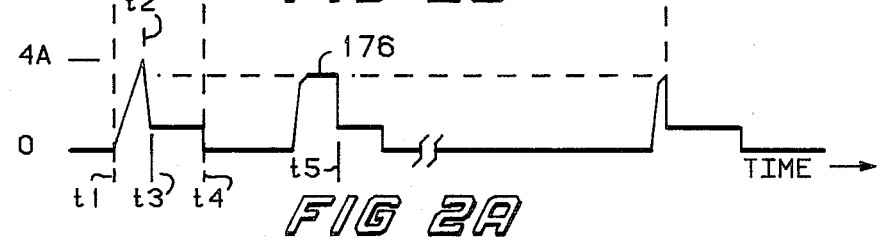

In normal operation, with the battery voltage source being substantially equal to 12 volts as shown in FIG. 2c, driver circuit 10 is responsive to an input signal (FIG. 2b) supplied at input terminal 16 to drive conductive coil 14 at output terminal 12 as previously described. Thus, with the input signal at a low level state, transistor 44, which has the base thereof coupled via resistor 46 to input terminal 16, is maintained in a non-conductive state. However, when the input signal goes to a high level state transistor 44 is biased via resistors 46 and 48 to a conducting level state. Hence, with a low input level state transistors 50, 52 and 54, each having their base electrodes coupled via resistors 56, 58 and 60 to the collector of transistor 44, are rendered conductive, being biased from power supply through resistor 62. The collectors of transistors 50, 52 and 54 will therefore be at near ground potential. In this state, the collector of transistor 50 acts to reset latch 64 comprising transistors 66 and 68 along with associated resistors. Transistor 66 will be maintained in a non-conductive state thereby supplying a "logic zero" at the output of the latch taken at node 70. Thus, in the reset mode the output of latch 64, which is coupled to bistable reference source 24, places the reference source in a first state to provide a first current level at the output thereof at node 72 to resistor 22 as will be described hereinafter.

With latch 64 being in a reset state, transistor 74 of bistable reference source 24, which has its base coupled via resistor 76 to the output of the latch, is maintained in a non-conductive state which allows diode 78 to be forward biased. Transistors 80, 82, 84 and 86 which have their emitters respectively coupled to power supply terminal 32 through resistors 88–94, function as constant current sources to supply a current of the magnitude I at the respective collectors thereof. Hence, with diode 78 forward biased, a current equal to a magnitude, 4I, is supplied at output node 72 to produce a reference current of 4I through resistor 22. This reference current through resistor 22 produces a reference voltage at the base of transistor 96, the non-inverting input of comparator 34. Simultaneously, transistor 52 being in a conductive state, sinks the base current drive away from transistor 28 to maintain transistor 28 in a non-conductive state. Transistor 28, along with transistors 98 and 100 of power stage 18, form a triple transistor Darlington power amplifier to provide maximum current drive at output 12 when transistor 28 is rendered conductive. With transistor 28 being in a non-conductive state no output current is provided at output terminal 12. Thus, as shown in FIG. 2a, at time interval t1, no output current is provided at output terminal 12.

At time t1 when the input signal goes to a high level state, transistor 44 is rendered conductive to turn off transistors 50, 52 and 54. With transistor 52 being in a non-conductive state transistor 28 is released and base current drive is provided thereto from transistors 102 and 104 which act as a base current source thereto. Thus, transistor 28 is rendered conductive and power amplifier 18 is driven into a saturated state to supply maximum output current at output terminal 12 as shown between time interval t1–t2 of FIG. 2a. As understood, power amplifier 18 may be realized in integrated circuit form by a multi-emitter transistor having individual ballast resistors $R_b$ connected in series with each multi-emitter. For example, power amplifier 18 may comprise a power device having 104 emitters with respective ballast resistors $R_b$. Hence, if 104 ballast resistors are utilized, an equal percentage of total output current supplied at out terminal 12 will be conducted through each resistor. Thus, one of the ballast resistors, i.e. resistor 20 may be utilized to sense the current provided at output terminal 12 to compare this current with the reference current supplied through reference resistor 22 in order to determine when the current at output terminal 12 has reached a predetermined peak magnitude.

With bistable reference source 24 being in a state wherein a current of magnitude 4I is provided at output 72, a reference voltage is produced across reference resistor 22 and transistor 96 is rendered conductive as current is provided thereto from current source transistor 108. As long as the current through sense resistor 20 is less than the current through resistor 22, transistor 110 will be rendered conductive through current turn-around circuit 112 comprising diode 114 and transistor 116. Transistor 118 will be rendered non-conductive as are transistors 120 and 122. With transistor 120, which is connected as a diode in series between transistor 118 and 122 and which has a collector output connected to the base of transistor 124 being non-conductive, transistor 124 is maintained in a non-conductive state wherein the collector thereof will be in a "logic one" state. Therefore, with transistor 120 being non-conductive, transistor 68 is maintained in a conductive state as previously described.

Driver circuit 10 will remain in the aforedescribed state until such time that the current produced at output terminal 12 reaches a peak magnitude, at time t2, i.e., when the peak magnitude of current becomes substantially equal to the current provided at output 72 of reference source 24. At this time, if the output current at output terminal 12 tries to become greater than the value at current supplied at the output of reference source 24 the gain of comparator amplifier 34 is great enough to rapidly cause transistor 110 as well as transistor 116 to be rendered non-conductive. As transistor 116 becomes non-conductive, transistor 118 is driven from transistor 108 rendering it conductive as well as transistors 120 and 122 connected in series therewith. As transistor 122 becomes conductive, base current drive is reduced to transistor 28 to reduce power drive to power device 18. Hence, between time intervals t2 and t3 (FIG. 2a), the output current produced at output terminal 12 rapidly decreases to a second pre-determined level between time interval t3–t4. The level to which the output current at output terminal 12 is reduced to is established by bistable reference source 24 in the following manner. As transistor 120 becomes conductive current is supplied from the collector thereof through resistor 128. This causes transistor 124 to become conductive putting a "logic zero" at the set terminal of latch 64 to cause transistor 68 to become non-conductive. When transistor 68 becomes non-conductive, transistor 74 is rendered conductive to reverse bias diode 78. Therefore, with diode 74 reversed biased, transistor 86 provides the current output at output node 72 which now has a value of only I. Hence, the voltage across reference resistor 22 is reduced by a factor of four; this causes the current at output terminal 12 to be reduced until such time that the voltage produced across trim network 126 and sense resistor 20 (which is supplied to the base of transistor 110 of comparator 34) becomes equal to the new reference voltage produced across reference resistor 22 by the reduced current drive from the output of bistable reference source 24. The output from output terminal 12 will remain constant until time t4 when the input signal supplied to input terminal 16 of driver circuit 10 goes to a low level state which resets latch 64 to again forward bias diode 78 as previously discussed and to shunt base current drive away from transistor 28 through the collector emitter path of transistor 52.

By co-locating reference resistor 22 with sense resistor 20 within the integrated circuit and by forming these two resistors of like semiconductor material, driver circuit 10 will function independently of temperature variations of the integrated circuit comprising the driver circuit. Also, by utilizing a resistive trim network between the inverting input of comparator 34 and the multiple emitters of the power transistor comprising power device 18, process variations can be eliminated by selective opening by laser or other means of links A. Therefore, the peak magnitude at which the driver circuit 10 is switched is set in production by monitoring the output current at output terminal 12 and trimming to the desired level by opening selective links A. Therefore, process variations between individual integrated circuit chips are eliminated by production trimming.

A startup circuit comprising diode 130 connected in a current mirror configuration with transistor 132 is provided to ensure that driver circuit 10 becomes functional when the power supply potential is supplied thereto. Thus, as driver circuit 10 is turned on, diode 130 which is connected to the power supply rail via resistor 134 is instantly rendered conductive which turns transistor 132 on. With transistor 132 being rendered conductive, the collector-to-emitter path provides a source for current for transistor 136 to render it conductive. With transistor 136 being rendered conductive, the current source comprising transistors 138, 140 and 142 and associated resistors 144 and 146 are allowed to be biased up to set the current through current source transistors 80, 82, 84, 86, 102, 104 and 108 as understood. After driver circuit 10 is biased up into operation as previously described, the turn-on circuit comprising diode 130 and transistor 132 is rendered non-active by the feedback from transistor 108 via lead 148 to the emitter of transistor 132 which shuts this transistor off.

The reference current source comprising transistors 138–142 is a well known $\Delta\phi$ current reference source wherein a $\Delta\phi$ voltage (having a positive temperature coefficient) is established across resistor 146. In the present invention, resistor 146 is fabricated of semiconductor material having a temperature coefficient which is substantially equal to the temperature coefficient of the voltage established thereacross such that the current produced through the collector-emitter of transistor 142 has a substantially zero temperature coefficient. Hence, the current produced at output node 72, from bistable reference current source 24, will also have a zero temperature coefficient. This is an important feature of the present invention in that, although the resistor values of reference resistor 22 and sense resistor 20 may vary with temperature variations of driver circuit 10, the peak magnitude of output current at which the output current from driver circuit 10 is switched does not vary with temperature variations.

In one feature of the preferred embodiment there is provided a novel thermal shutdown circuit 38 for preventing damage of the power device 18. The novelty associated with thermal shutdown 38 relies in establishing a voltage at the base of transistor 150 which has a positive temperature coefficient that is a ratio of the positive temperature coefficient of the $\Delta\phi$ voltage established across resistor 146. Thus, although the current supplied through the collector of transistor 142 has a zero temperature coefficient and the output collector current of transistor 108 via lead 148 also has a zero temperature coefficient, it is to be remembered that this current was generated from a voltage which had a positive temperature coefficient, i.e., the $\Delta\phi$ voltage across resistor 146. Therefore, the voltage developed across the resistor 152 also has a positive temperature coefficient, the magnitude thereof being a function of the ratio of the values of resistors 152 and 146. This means that the voltage established at the base of transistor 150 will have the pre-determined positive temperature coefficient associated thereto. Hence, as the integrated circuit in which driver circuit 10 is fabricated is caused to heat up by excessive power dissipation in power device 18 a point will be reached that forward biases the base-to-emitter junction of transistor 150 to cause transistor 150 to become conductive. At this temperature, when transistor 150 becomes conductive, base current drive is shunted via resistor 154 from driver transistor 28 to reduce drive to the power device which in turn then causes this device to be turned off. Driver circuit 10 is therefore protected from becoming overheated by excessive power dissipation in power device 18.

Circuit 156 which is controlled by an input signal supplied at control terminal 158 provides several unique functions as will be explained. If, for example, driver circuit 10 is to be utilized in fuel injection systems circuit 156 can be utilized to prevent damage to the injectors when the battery voltage of the automobile is sufficiently low. For instance, if the battery voltage is low (as shown by waveform portion 160 of FIG. 2c) there may not be enough voltage produced across inductive coil 14 to allow the current generated therethrough to ramp to the maximum peak magnitude as shown in FIG. 2a. For instance, if the peak magnitude is set at four amps, the low voltage across coil 14 may only allow the current supplied at output terminal 12 to ramp up to 3.99 amps. Thus, comparator 34 could not be activated to reduce the output current from driver circuit 10 to the low level as previously discussed. Thus, the current through coil 14 would remain at this high level and potentially damage the injectors. Hence, it is desired to be able to sense when the battery voltage is low such that the output of driver circuit 10 will be switched to a lower current level after a predetermined time in order to protect the injectors. Circuit 156 is utilized in conjunction with a derived input signal at terminal 158 to cause the output of driver circuit 10 to be switched to the lower current level after a predetermined time if the peak magnitude of current therefrom has not been reached.

In one embodiment of the present invention, input terminal 158 may be coupled to an external RC network where the input signal produced thereat is the voltage developed across the capacitor. By utilizing an external RC network the charging of the capacitor is independent of operation of driver circuit and is controlled by the RC time constant. Thus, with a zero level input signal at input terminal 16, transistor 54, as previously discussed, is rendered conductive which, via resistor 160, would cause discharge of the external capacitor to a zero voltage as shown at time t1 (FIG. 2d). With transistor 54 being conductive, transistor 168 is rendered conductive which causes the base of transistor 170 to be at low voltage level rendering this transistor non-conductive. At time t1 when the input signal at input terminal 16 goes to a high level state, transistor 54 is rendered non-conductive which allows the external capacitor to begin ramping upwards as shown by waveform portion 172 of FIG. 2d. Thus, the voltage level at terminal 158 will increase until such time that transistor 168 is rendered non-conductive which allows transistor 162 to become conductive. Transistor 162 is biased through resistors 164 and 166 to a voltage level compatible with TTL circuitry when $V_{BAT}$ is maximum. As transistor 162 becomes conductive, the current from the collector thereof renders transistor 170 conductive via resistor 174. Transistor 170 and transistor 124 are connected in an OR configuration such that with either one of these two transistors becoming conductive causes latch 64 to be set which as previously explained causes the output current at output terminal 12 of driver circuit 10 to be reduced to the lower level state. Hence, if the peak magnitude of current (time T2) has been reached previous to transistor 162 becoming conductive, transistor 124 will have already set latch 64 and the output from driver circuit 10 is reduced at time t3 to its lower current level state. However, if the battery voltage source is sufficiently low, as shown by waveform portion 160 of FIG. 2c, the output of driver circuit 10 will never reach the peak magnitude output. This is shown by waveform portion 176 of FIG. 2a. Hence, latch 64 cannot be set by transistor 124 whereby the output current level will remain at a constant level somewhere below the predetermined peak magnitude. Without circuit 156, the output current level of driver circuit 10 will remain constant. However, when the external capacitor is charged to the voltage level to render transistor 168 non-conductive, transistor 170 is rendered conductive to set the latch as shown at time t5 of FIG. 2a to reduce the output current level from driver circuit 10 to the lower current level.

In some applications circuit 156 might be utilized in conjunction with a control voltage being supplied at input terminal 158 as shown by waveform portion 178. In this manner, the current level at output terminal 12 can be switched to its lower current level if the peak magnitude current level has not been reached by a predetermined time interval after the input signal at input terminal 16 has switched to its higher level state.

One additional feature of the present invention utilizes control circuit 156. By connecting input terminal 158 to input terminal 16, circuit 10 functions as a load protected integrated power switch. In this application, whenever the input signal at input 16 goes high the output current provided at output 12 is fully conductive and constant, being set at any desired limit level within the dynamic range of trim network 126. If the load current exceeds the predetermined limit value the output (power stage 18) goes into an active state and thermal shutdown circuit 38 can protect the integrated circuit if excessive heating occurs as was previously described.

Therefore, what has been described above is a novel driver circuit for driving inductive or resistive loads. The driver circuit is suitable to be fabricated entirely as an integrated circuit device including the power stage and functions by comparing a percentage of the load current to an internally generated reference current for switching the load current when a predetermined peak magnitude is reached to a constant, predetermined sustaining level.

We claim:

1. Circuit for providing current to a load, comprising:
    power stage means coupled to the load including current sensing means for sensing the magnitude of the load current;
    comparator means having first and second inputs and outputs, said first input receiving a reference signal, said second input being coupled to said current sensing means, said first output being coupled to said power stage means said comparator means being responsive to said reference signal being of a first predetermined magnitude for rendering said power stage means conducting such that current is supplied to the load, said comparator being responsive to the load current reaching a peak magnitude for providing output signals at said first and second outputs such that said power stage means is rendered less conducting whereby the magnitude of load current abruptly decreases;
    bistable reference means being coupled to said second output of said comparator means and being responsive to an applied input signal for providing said reference signal, said bistable reference means being responsive to said output signal appearing at said second output of said comparator means for providing a reference signal of a second predetermined magnitude such that the load current is caused to be decreased to a level representative of said second predetermined magnitude of said reference signal;
    input circuit means adapted to receive said input signal for producing a first output signal at first and second outputs when said input signal is in a first level state and for producing a second output signal when said input signal is in a second level state, said first output being coupled to said power stage means such that said first output signal inhibits said power stage means from being rendered conducting; and
    latch circuit means having first and second inputs and an output, said first input being coupled to said second output of said input circuit means, said second input being coupled to said second output of said comparator means, said output being coupled to an input of said bistable reference means, said latch circuit means being responsive to said first output signal from said input circuit means for maintaining said bistable reference means in a first state for supplying said reference signal of a first predetermined magnitude, said latch circuit means being responsive to said output signal appearing at said second output of said comparator means for causing said bistable reference means to provide said reference signal of a second predetermined magnitude.

2. A single chip integrated circuit for providing current from a power supply to an inductive load, comprising:
    power stage means coupled with the power supply having an output adapted to be coupled to the inductive load and including internal current sensing means for sensing the magnitude of the load current;
    comparator means having first and second inputs and outputs respectively, said first input being adapted to receive a reference signal, said second input being coupled to said current sensing means, said first output being coupled to an input of said power stage means, said comparator being responsive to said reference signal being of a first predetermined magnitude for rendering said power stage conductive to thereby provide current to the inductive lead, said comparator means being responsive to the load current reaching a predetermined peak magnitude for producing an output signal at said first and second outputs such that said power stage means becomes abruptly less conductive to reduce the load current;
    bistable reference circuit means which is responsive to an alternating input signal supplied to the integrated circuit for supplying a reference current of a first value at an output, said bistable reference circuit means being responsive to said output signal produced at said second output of said comparator means for supplying a reference current at said output of a second value whereby the load current is reduced to a level representative of the second value of said reference current; and
    circuit means coupled to said output of said bistable reference circuit means and said first input of said comparator means for converting said reference current provided from said bistable reference circuit to said reference signal applied to said comparator means.

3. The circuit of claim 2 including:
    input circuit means having an input, first and second outputs, said input being adapted to receive said alternating input signal, said input circuit means being responsive to said alternating input signal being in a first level state for producing a first logic output signal at said first and second outputs, said input circuit means being responsive to said alternating input signal being in a second level state for producing a second logic output signal at said first and second outputs; said first output being coupled to said input of said power stage means such that said first logic output signal inhibits said power stage means from being rendered conductive; and latch circuit means having first and second inputs and an output, said first input being coupled to said second output of said input circuit means, said second input being coupled to said second output of said comparator means, said output being coupled to an input of said bistable reference circuit means, said latch circuit means being responsive to said first logic output signal for causing said bistable reference circuit means to be in a first state for producing said reference current of a first value, said latch circuit means being responsive to said output signal from said comparator means for causing said bistable reference circuit means to switch to a second state for producing said reference current of a second value.

4. The circuit of claim 3 wherein said power stage means includes:

power transistor means having a plurality of emitter electrodes, a base and a collector electrode, said base electrode being coupled to said input of said power stage means, said collector electrode being adapted to be connected to an output terminal at which is connected the inductive load, a plurality of ballast resistor means each coupled between a respective one of said plurality of said emitter electrodes and a first terminal at which is supplied a ground reference potential; and said current sensing means including a selected one of said plurality of ballast resistor means and a resistive trim network coupled between said selected one of said ballast resistor means and said first terminal, said network having an output coupled to said second input of said comparator means.

5. The circuit of claim 4 wherein:

said plurality of ballast resistor means being fabricated of a selected semiconductor material; and said circuit means being a resistive means placed in close spaced relationship to said selected one of said plurality of ballast resistors and being fabricated of said semiconductor material whereby said resistive means and said selected ballast resistor means vary in a like manner with temperature variations.

6. The circuit of claim 5 wherein said power stage means includes a first transistor having a base, an emitter and collector, said base being coupled to said input of said power stage means, said collector being coupled to a second terminal at which is supplied a power supply potential, said emitter being coupled to said base of the power transistor means.

7. The circuit of claim 6 wherein said bistable reference circuit means includes:

a second transistor having a base, an emitter and collector, said base being coupled to said output of said latch circuit means, said emitter being coupled to said first terminal;

first current source means coupled between said second terminal and said collector of said second transistor for providing a current of a predetermined magnitude;

second current source means coupled between said second terminal and said output of said bistable reference circuit means for providing a current of a predetermined magnitude which is of a predetermined ratio with respect to said magnitude of said current provided by said first current source; and diode means coupled between said collector of said second transistor and said output of said bistable reference circuit means.

8. A monolithic integrated circuit for providing current to the coil of an injector valve, comprising:

power supply conductor means adapted to receive an applied source of operating potential;

power stage means having an input and an output, said output being coupled to an output of the circuit to the coil for supplying current thereto including current sensing means for sensing the magnitude of the current through the coil;

bistable reference means responsive to a first input signal for producing a first output current of a first value and responsive to a second input signal for producing a second output current of a second value;

circuit means having first and second inputs and outputs, said first input being coupled to an input of the circuit, said first output being coupled to said bistable reference means, said second output being coupled to said input of said power stage means, said circuit means being responsive to an applied input signal being in a first level state for producing a first logic signal at said first and second outputs such that said bistable reference means is caused to produce said first output current and said power stage means is maintained in a non-conductive state, said circuit means being responsive to said applied input signal being in a second level state wherein said power stage means is no longer inhibited from conducting; and comparator means having first and second inputs and outputs, said first input being coupled to the output of said bistable reference means, said second input being coupled to said current sensing means, said first output being coupled to said input of said power stage means, said second output being coupled to said second input of said circuit means, said comparator means being responsive to said first output current from said bistable reference means when said applied input signal is in said second level state for rendering said power stage conductive and being responsive to said load current through said current sensing means reaching a peak magnitude indicative of said first output current from said bistable reference means for generating output signals at said first and second outputs respectively such that said circuit means produces said second input signal to said bistable reference means and said power stage means is caused to become less conductive until the magnitude of load current reaches a level indicative of said second output current from said bistable reference circuit means.

9. The circuit of claim 8 wherein said power stage means includes:

a Darlington configured power transistor means having a base input, a collector output and a plurality of emitters, said collector being coupled to said output of the circuit;

a plurality of ballast resistors formed of semiconductor material each of which is coupled between a respective one of said plurality of emitters and a first terminal at which is supplied a ground reference potential; and a first transistor having a base, an emitter and a collector, said collector being coupled to said power supply conductor means, said base being coupled to said input of said power stage means, said emitter being coupled to said base of said power transistor means.

10. The circuit of claim 9 wherein said bistable reference means includes:
 a second transistor having a base, an emitter and a collector, said base being coupled to said input of said bistable reference means, said emitter being coupled to said first terminal;
 first current source means for supplying a first current of a first predetermined magnitude, said first current source means being coupled between said power supply conductor means and said collector of said second transistor;
 second current source means for supplying a second current of a second predetermined magnitude which is of a predetermined ratio of said first current from said first current source, said second current source means being coupled between said power supply conductor and said output of said bistable reference means; and
 diode means coupled between said collector of said second transistor and said output of said bistable reference means.

11. An integrated circuit for supplying a multi-level current to a load coupled thereto in response to an input signal supplied to the circuit, comprising:
 power stage means responsive to a drive signal for supplying the load current to the load including current sensing means for sensing a proportional amount of said load current;
 reference current source means responsive to the input signal for providing a reference current of either a first or a second predetermined magnitude; and
 comparator means coupled with said reference current source means and said load current sensing means which is responsive to said sensed load current being of less magnitude than said reference current of said first magnitude for supplying a drive signal to said power stage means such that a load current of a first level is supplied to the load, said comparator means being responsive to the sensed load current reaching a magnitude representative of said reference current of said first magnitude for causing said reference current source means to provide said current of said second magnitude and to provide a reduced drive signal to said power stage means such that the load current is reduced to a second level representative of said reference current of said second magnitude.

12. The integrated circuit of claim 11 wherein said power stage means includes:
 a multi-emitter Darlington configured power transistor having n emitters; and
 said current sensing means having a plurality of n ballast resistor each associated with a respective one of said n emitter, at least one of said resistors being coupled with an input of said comparator means.

13. The integrated circuit of claim 11 or 12 wherein said reference current source means includes:
 first current source means for providing a current of a first magnitude;
 second current source means for providing a current of a second magnitude, said second current source means being coupled to the output of said reference current source means; and
 switching means for selectively coupling and decoupling said first current source to said output of said reference current source means in response to an applied input signal from said comparator means.

14. The integrated circuit of claim 13 wherein said comparator means includes:
 resistive means coupled between said output of said reference current source means to a first input of said comparator means;
 differential amplifier means having first and second inputs and an output, said first input being coupled to said first input of said comparator means, said second input being coupled to a second input of said comparator means, said second input of said comparator means being coupled to said current sensing means; and
 cascoded output switch means coupled between said output of said differential amplifier means to an input of said power stage means, said cascoded output switch means having an additional output coupled to said reference current source means.

15. The integrated circuit of claim 14 wherein said switching means of said reference current source means includes:
 first transistor means having first, second and control electrodes, said first electrode being coupled to a first terminal at which is supplied a ground reference potential, said second electrode being coupled to said first current source means;
 diode means coupled between said second electrode of said first transistor means and said output of said reference current source means; and
 latch circuit means having first and second inputs and an output, said first input being coupled to the input of the integrated circuit, said second input being coupled to said additional output of said cascoded output switch means of said comparator means, said output being coupled to said control electrode of said first transistor means.

16. The integrated circuit of claim 15 including programmable circuit means having first and second inputs and an output, said first input being coupled to a reference potential, said output being coupled to said second input of said latch circuit means, said second input being adapted to be connected to said input of the integrated circuit such that the integrated circuit functions as an integrated power switch.

17. The integrated circuit of claim 16 including thermal shutdown circuit means coupled with said input of said power stage means which is responsive to excessive heat dissipation in said power stage means for rendering said power stage means non-conductive.

* * * * *